(12) United States Patent
Kim et al.

(10) Patent No.: US 11,778,844 B2
(45) Date of Patent: Oct. 3, 2023

(54) LIGHT EMITTING ELEMENT AND DISPLAY PANEL INCLUDING THE SAME

(71) Applicant: Samsung Display Co., Ltd., Yongin-si (KR)

(72) Inventors: Sungwook Kim, Hwaseong-si (KR); Kyungsik Kim, Suwon-si (KR); SeulOng Kim, Hwaseong-si (KR); Tsuyoshi Naijo, Suwon-si (KR); Sung-Soo Bae, Seoul (KR); Dongchan Lee, Sejong-si (KR); Hyein Jeong, Suwon-si (KR); Hyewon Choi, Suwon-si (KR); Seung-Jin Chu, Gwangmyeong-si (KR); Jaeweon Hur, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 505 days.

(21) Appl. No.: 16/901,672

(22) Filed: Jun. 15, 2020

(65) Prior Publication Data

US 2021/0036255 A1  Feb. 4, 2021

(30) Foreign Application Priority Data

Jul. 30, 2019  (KR) .................. 10-2019-0092404

(51) Int. Cl.
*H01L 27/32*  (2006.01)
*H01L 27/15*  (2006.01)
(Continued)

(52) U.S. Cl.
CPC ............. *H10K 50/12* (2023.02); *H10K 50/15* (2023.02); *H10K 50/16* (2023.02)

(58) Field of Classification Search
CPC ............ H01L 51/5056; H01L 51/5072; H01L 51/5265; H01L 51/5012; H01L 51/5016;
(Continued)

(56) References Cited

U.S. PATENT DOCUMENTS

| 8,847,218 B2 | 9/2014 | Nishimura et al. |
| 10,134,813 B2 | 11/2018 | Choi |
| 2006/0158104 A1 | 7/2006 | Iijima et al. |
| 2012/0248424 A1* | 10/2012 | Sasaki ................ H10K 50/13 257/E51.026 |

(Continued)

FOREIGN PATENT DOCUMENTS

| JP | 4496948 B2 | 7/2010 |
| KR | 10-0846608 B1 | 7/2008 |

(Continued)

OTHER PUBLICATIONS

Quantum dot white light diode—Machine Translation Sep. 25, 2018 (Year: 2018).*

*Primary Examiner* — Omar F Mojaddedi
(74) *Attorney, Agent, or Firm* — Lewis Roca Rothgerber Christie LLP

(57) ABSTRACT

A light emitting element includes: a first electrode, a second electrode facing the first electrode, a first light emitting layer between the first electrode and the second electrode to emit a first light, a second light emitting layer between the first light emitting layer and the second electrode to emit a second light, and an intermediate layer including a host material between the first light emitting layer and the second light emitting layer and, wherein the intermediate layer has a thickness of from about 90 nm to 170 nm.

11 Claims, 5 Drawing Sheets

(51) Int. Cl.

| | |
|---|---|
| *H01L 33/08* | (2010.01) |
| *H01L 33/14* | (2010.01) |
| *H01L 33/26* | (2010.01) |
| *H01L 33/50* | (2010.01) |
| *H01L 33/36* | (2010.01) |
| *H10K 50/12* | (2023.01) |
| *H10K 50/15* | (2023.01) |
| *H10K 50/16* | (2023.01) |

(58) Field of Classification Search
CPC ... H01L 27/3211; H01L 27/156; H01L 33/08; H01L 33/14; H01L 33/26; H01L 33/36; H01L 33/50; H10K 50/11; H10K 50/12; H10K 50/131; H10K 50/15; H10K 50/16; H10K 50/582
See application file for complete search history.

(56) References Cited

U.S. PATENT DOCUMENTS

| | | | |
|---|---|---|---|
| 2012/0286305 A1* | 11/2012 | Sasaki | H10K 50/852 257/89 |
| 2013/0292664 A1* | 11/2013 | Nishimura | H10K 50/131 257/40 |
| 2017/0243929 A1* | 8/2017 | Choi | H01L 51/5265 |
| 2021/0083216 A1* | 3/2021 | Su | H01L 51/5016 |

FOREIGN PATENT DOCUMENTS

| | | |
|---|---|---|
| KR | 10-1417789 B1 | 8/2014 |
| KR | 10-2017-0100093 A | 9/2017 |
| KR | 10-1870471 B1 | 6/2018 |
| KR | 10-2018-0122578 A | 11/2018 |

* cited by examiner

LIGHT EMITTING ELEMENT AND DISPLAY PANEL INCLUDING THE SAME

CROSS-REFERENCE TO RELATED APPLICATION

This application claims priority to and the benefit of Korean Patent Application No. 10-2019-0092404, filed on Jul. 30, 2019, the entire contents of which are incorporated herein by reference.

BACKGROUND

1. Field

Embodiments of the present disclosure relate to a light emitting element and to a display panel including the same, and, for example, to a light emitting element having improved service life and luminous efficiency and a display panel including the same.

2. Related Art

Various display devices, which are to be used for multimedia devices such as TVs, mobile phones, tablet computers, navigators and game machines, are being developed. Some of these display devices use a so-called self-luminous display element, which implements displaying by causing a luminous material to emit light.

For example, the light-emitting element may produce excitons by recombining holes and electrons injected from a first electrode and from a second electrode, and emits light by lowering the state of the produced excitons to the ground state.

To apply a light-emitting element to a display device, the light-emitting element should have improved luminous efficiency and service life, and there is an ongoing demand for development of a light-emitting element capable of providing such performance.

SUMMARY

Embodiments of the present disclosure provide a light emitting element with improved efficiency and service life.

Embodiments of the present disclosure also provide a display panel having a light emitting element with improved efficiency and service life.

In some embodiments, a light emitting element includes: a first electrode; a second electrode facing the first electrode; a first light emitting layer between the first electrode and the second electrode to emit a first light; a second light emitting layer between the first light emitting layer and the second electrode to emit a second light; and an intermediate layer including a host material between the first light emitting layer and the second light emitting layer, wherein the intermediate layer has a thickness of about 90 nm to about 170 nm.

In some embodiments, the intermediate layer may have bipolar characteristics to transport electrons and holes.

In some embodiments, each of the first light emitting layer and the second light emitting layer may include the host material and a dopant material.

In some embodiments, the light emitting element may further include a hole transporting area between the first electrode and the first light emitting layer; and an electron transporting area between the second light emitting layer and the second electrode.

In some embodiments, an emission wavelength range of the first light and an emission wavelength of the second light may be substantially the same.

In some embodiments, the first electrode may include an upper surface facing the second electrode and a lower surface opposite to the upper surface, the first light emitting layer may include an upper surface facing the second electrode and a lower surface opposite to the upper surface, the second light emitting layer may include an upper surface facing the second electrode and a lower surface opposite to the upper surface. Further, a distance from the upper surface of the first electrode to the lower surface of the first light emitting layer may be a first optical distance at which the first light secondarily resonates optically, and a distance from the upper surface of the first electrode to the lower surface of the second light emitting layer may be a second optical distance at which the second light tertiarily resonates optically.

In some embodiments, the wavelength range of the first light may be from about 410 nm to about 480 nm, the first optical distance may be in a range from about 110 nm to about 150 nm, and the second optical distance may be in a range from about 230 nm to about 300 nm.

In some embodiments, the wavelength range of the first light may be from about 500 nm to about 570 nm, the first optical distance may be in a range from about 150 nm to about 190 nm, and the second optical distance may be in a range from about 250 nm to about 330 nm.

In some embodiments, the wavelength range of the first light may be from about 625 nm to about 675 nm, the first optical distance may be in a range from about 170 nm to about 230 nm, and the second optical distance may be in a range from about 290 nm to about 400 nm.

In some embodiments, a wavelength range of the first light may be from about 410 nm to about 480 nm and the thickness of the intermediate layer may be in a range from about 90 nm to about 120 nm.

In some embodiments, a wavelength range of the first light may be from about 500 nm to about 570 nm and the thickness of the intermediate layer may be from about 100 nm to about 130 nm.

In some embodiments, a wavelength range of the first light may be from about 625 nm to about 675 nm and the thickness of the intermediate layer may be from about 120 nm to about 170 nm.

In some embodiments, a light emitting element includes: a first electrode, a second electrode facing the first electrode; a first light emitting layer between the first electrode and the second electrode to emit a first light, a second light emitting layer between the first light emitting layer and the second electrode to emit a second light, and an intermediate layer including a single material between the first light emitting layer and the second light emitting layer, wherein a distance from the first electrode to the first light emitting layer may be a first optical distance at which the first light secondarily resonates optically, and a distance from the first electrode to the second light emitting layer may be a second optical distance at which the second light tertiarily resonates optically.

In some embodiments, the wavelength range of the first light may be from about 410 nm to about 480 nm, the first optical distance may be in a range from about 110 nm to about 150 nm, a thickness of the intermediate layer may be in a range from about 90 nm to about 120 nm, and the second optical distance may be in a range from about 230 nm to about 300 nm.

In some embodiments, the wavelength range of the first light may be from about 500 nm to about 570 nm, the first optical distance may be in a range from about 150 nm to about 190 nm, a thickness of the intermediate layer may be in a range from about 100 nm to about 130 nm, and the second optical distance may be in a range from about 250 nm to about 330 nm.

In some embodiments, the wavelength range of the first light may be from about 625 nm to about 675 nm, the first optical distance may be in a range from about 170 nm to about 230 nm, a thickness of the intermediate layer may be in a range from about 120 nm to about 170 nm, and the second optical distance may be in a range from about 290 nm to about 400 nm.

In some embodiments, a display panel includes: a base substrate, a circuitry layer on the base substrate, a plurality of light emitting elements on the circuitry layer to respectively emit light having different wavelength range. At least one of the plurality of light emitting elements may include: a first electrode, a second electrode facing the first electrode, a first light emitting layer between the first electrode and the second electrode to emit a first light, a second light emitting layer between the first light emitting layer and the second electrode to emit a second light, and an intermediate layer including a host material between the first light emitting layer and the second light emitting layer. Furthermore, the distance between the first electrode and the first light emitting layer is a first optical distance at which the first light secondarily resonates optically, and the distance between the first electrode and the second light emitting layer is a second optical distance at which the second light tertiarily resonates optically.

In some embodiments, a wavelength range of the first light may be from about 410 nm to about 480 nm, the first optical distance may be in a range from about 110 nm to about 150 nm, a thickness of the intermediate layer may be from about 90 nm to about 120 nm, and the second optical distance may be in a range from about 230 nm to about 300 nm.

In some embodiments, a wavelength range of the first light may be from about 500 nm to about 570 nm, the first optical distance may be in a range from about 150 nm to about 190 nm, a thickness of the intermediate layer may be from about 100 nm to about 130 nm, and the second optical distance may be in a range from about 250 nm to about 330 nm.

In some embodiments, a wavelength range of the first light may be from about 625 nm to about 675 nm, the first optical distance may be in a range from about 170 nm to about 230 nm, a thickness of the intermediate layer may be from about 120 nm to about 170 nm, and the second optical distance may be in a range from about 290 nm to about 400 nm.

BRIEF DESCRIPTION OF THE DRAWINGS

The accompanying drawings are included to provide a further understanding of the present disclosure, and are incorporated in and constitute a part of this specification. The drawings illustrate some exemplary embodiments of the present disclosure and, together with the description, serve to explain principles of the present disclosure. In the drawings.

DETAILED DESCRIPTION

Some exemplary embodiments of the present disclosure will be described below in more detail with reference to the accompanying drawings. The subject matter of the present disclosure may, however, be embodied in different forms and should not be construed as limited to the embodiments set forth herein. Rather, the exemplary embodiments should be considered to include alternations, equivalents, modifications and/or alternatives of the disclosed subject matter.

The word "and/or" includes one or more combinations that may be defined by relevant elements (e.g., by listed elements).

The terms "first", "second", etc. may be used in describing various elements. However, the elements shall not be restricted or limited to the above terms. These terms are only used to distinguish one element from another. For example, without departing from the scope of the present disclosure, the first element may be named as the second element, and similarly, the second element may be named as the first element. The singular forms used herein, unless the context clearly indicates otherwise, include the plural forms.

Unless otherwise defined, all the terms used herein (including technical terms and scientific terms) may have the same meanings as those generally understood by those skilled in the art to which the present disclosure pertains. Terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Terms such as "include" or "have" shall be understood to indicate the presence of the stated features, numbers, stages, operations, elements, components or any combinations thereof, and do not preclude the presence or addition of one or more features, numbers, stages, operations, elements, components or combinations thereof.

Hereinafter, a light emitting element (EE) and a display panel (DP) according to some embodiments of the present disclosure are described in more detail with reference to the accompanying drawings.

Figure 1:
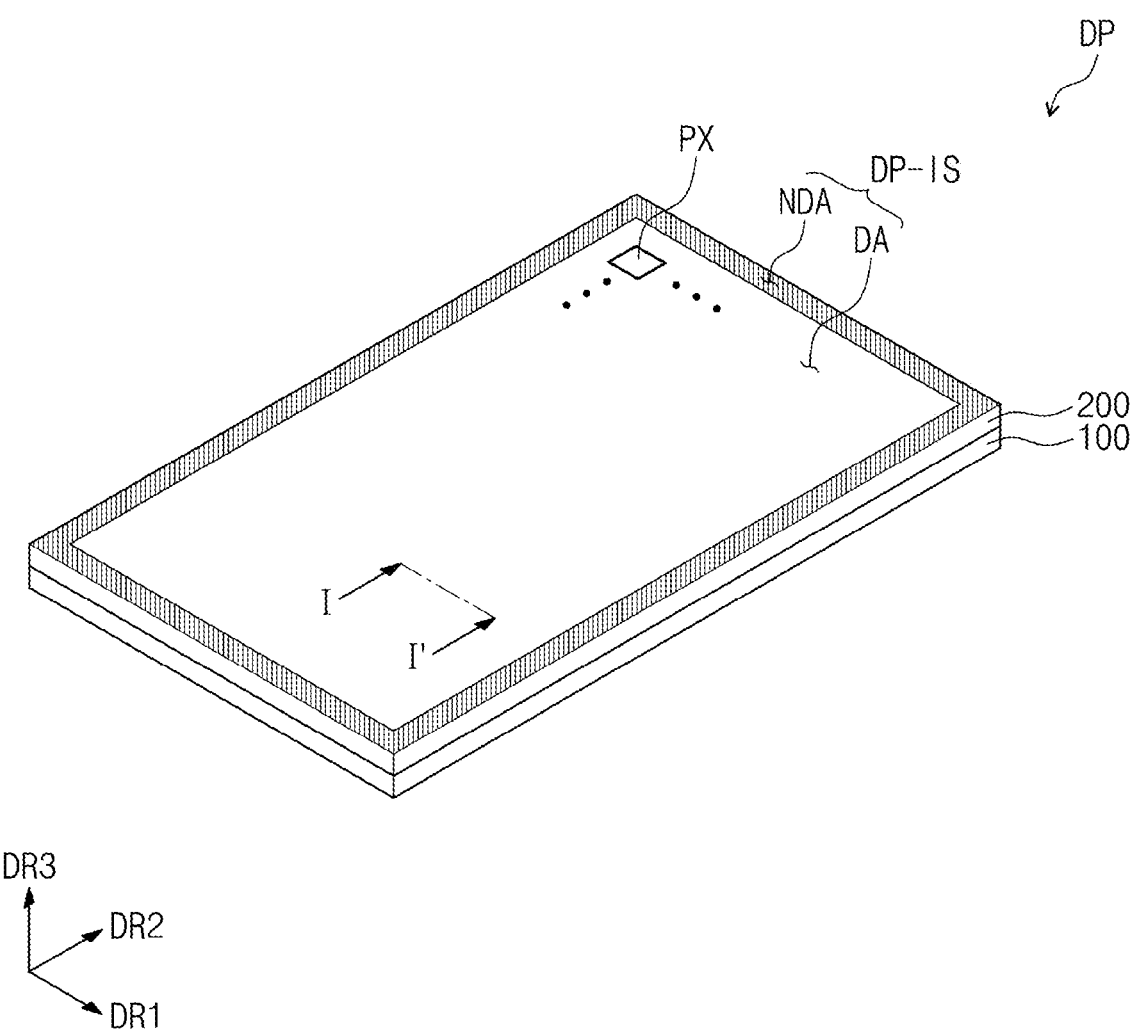
FIG. 1 is a perspective view of the display panel according to an embodiment.
Figure 2:
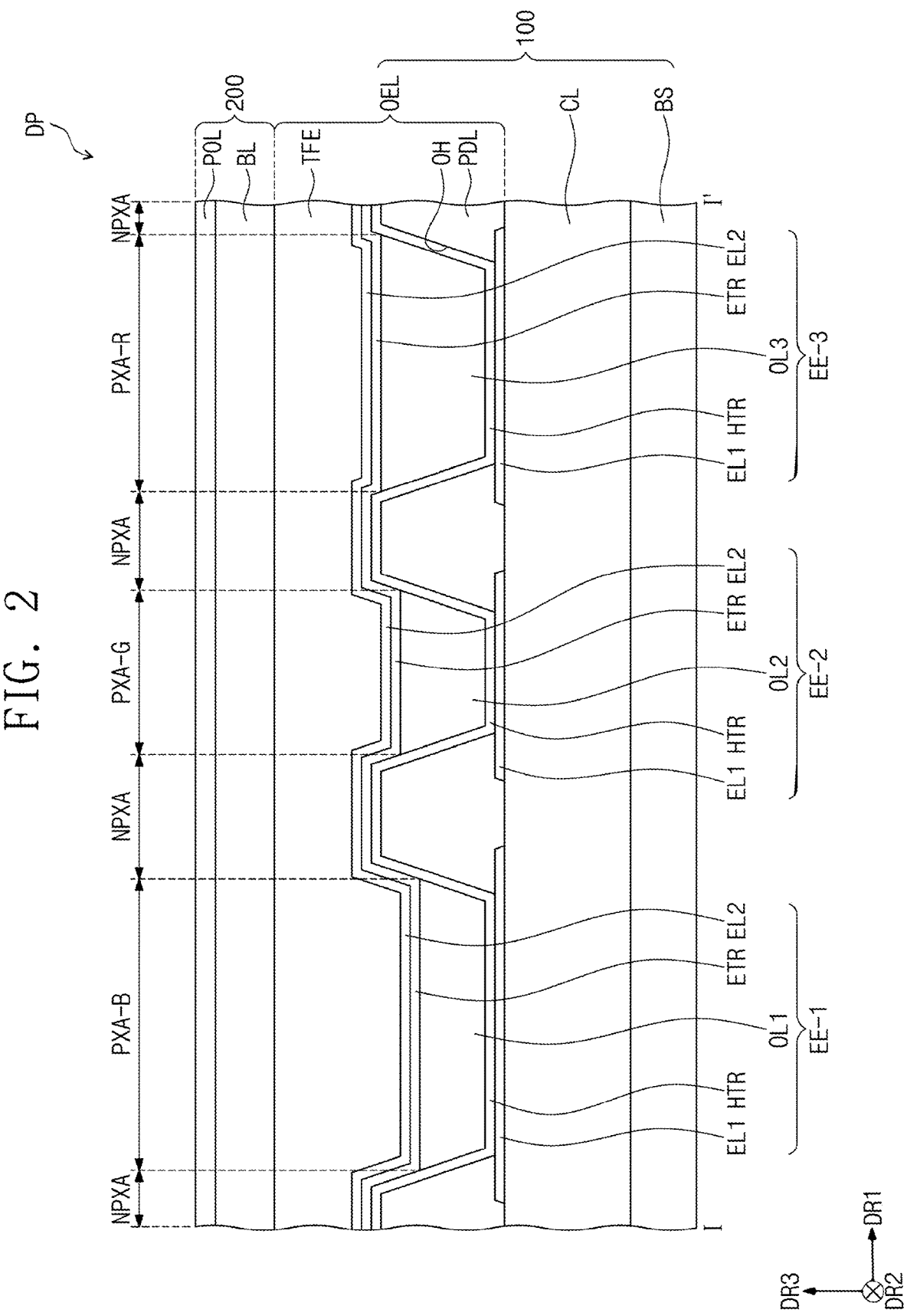
FIG. 2 is a cross-sectional view of the display panel according to an embodiment.
Figure 3:
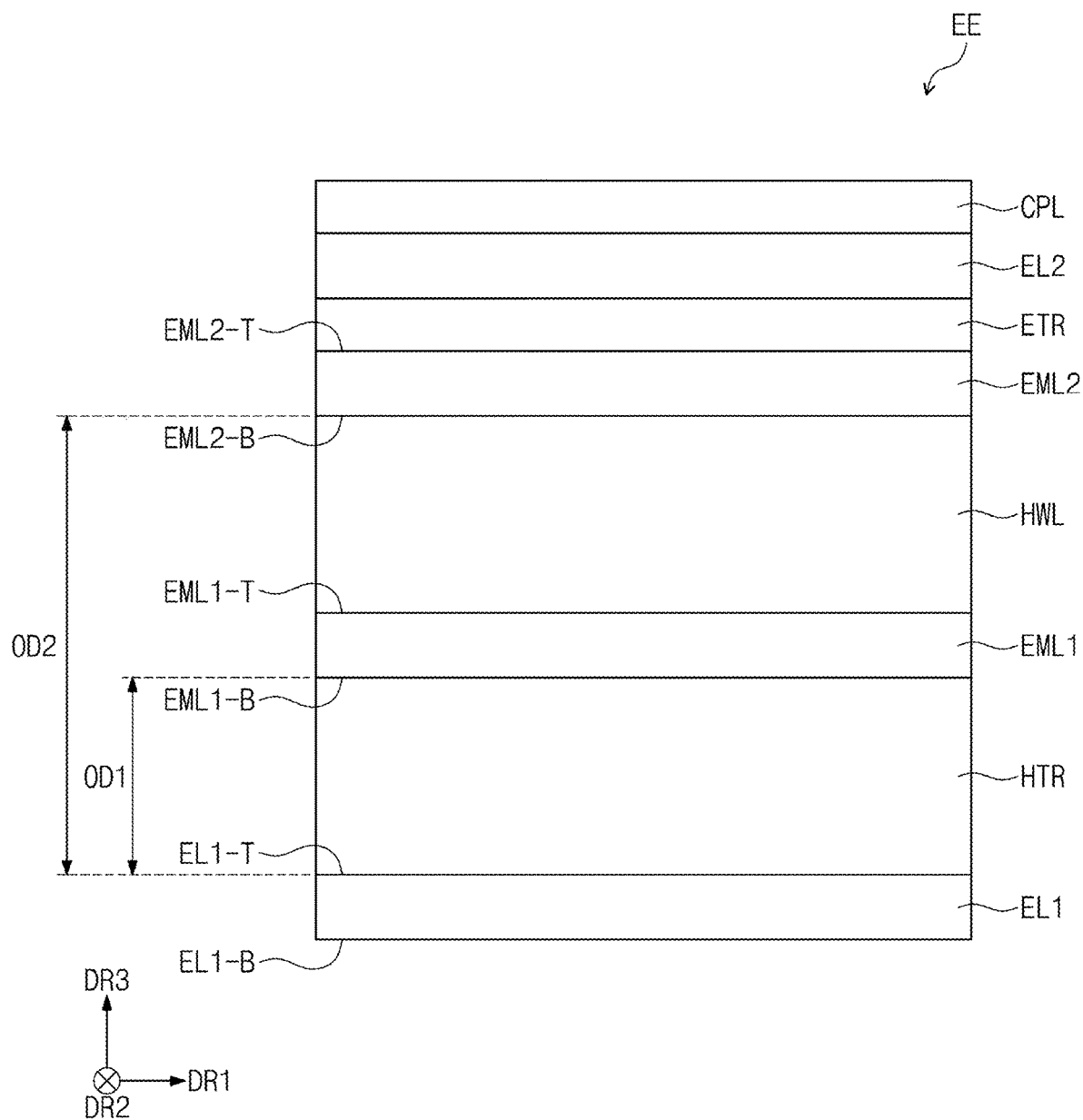
FIG. 3 is a cross-sectional view schematically illustrating a light emitting element according to an embodiment.
Figure 4:
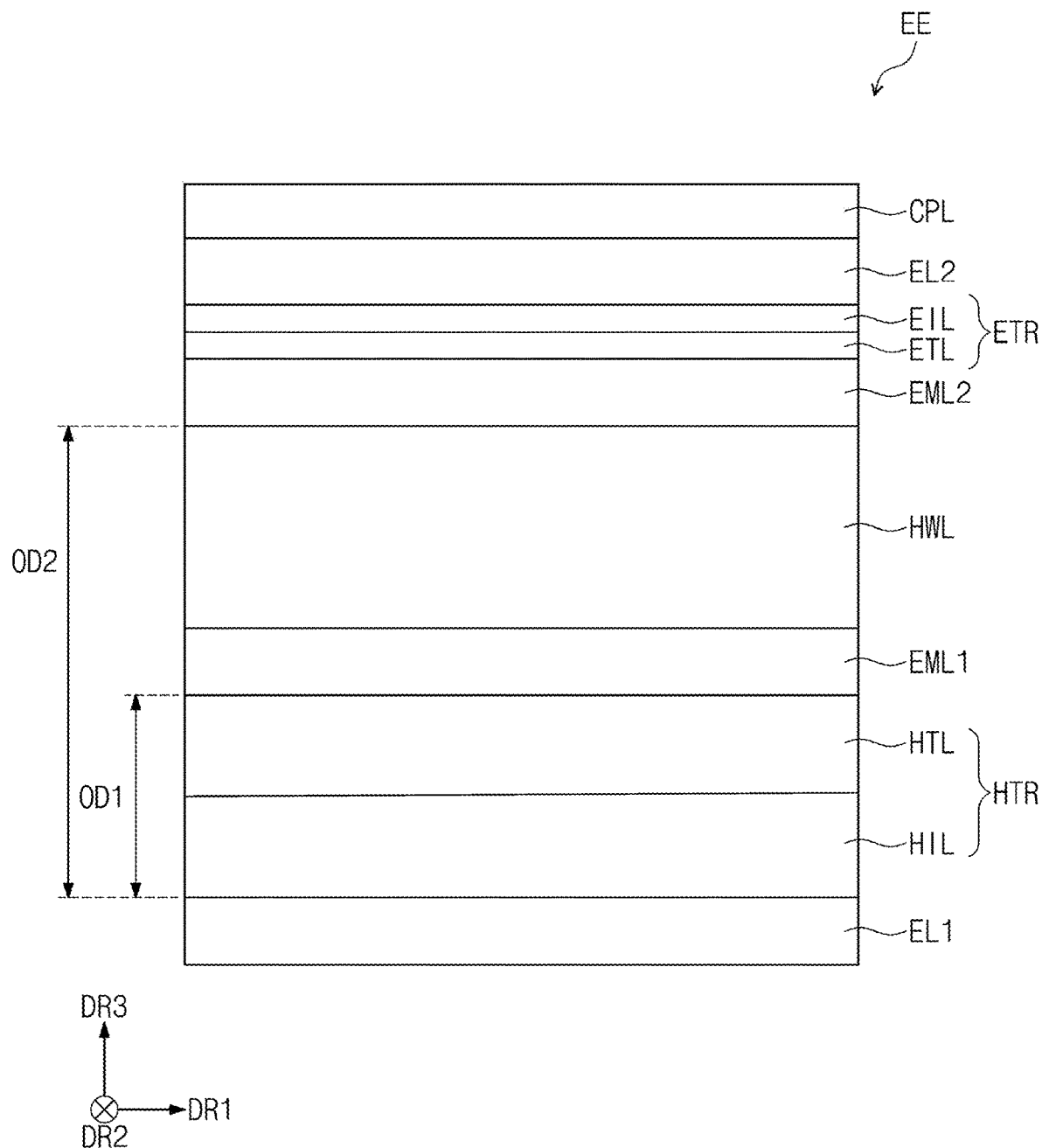
FIG. 4 is a cross-sectional view schematically illustrating a light emitting element according to an embodiment.
Figure 5:
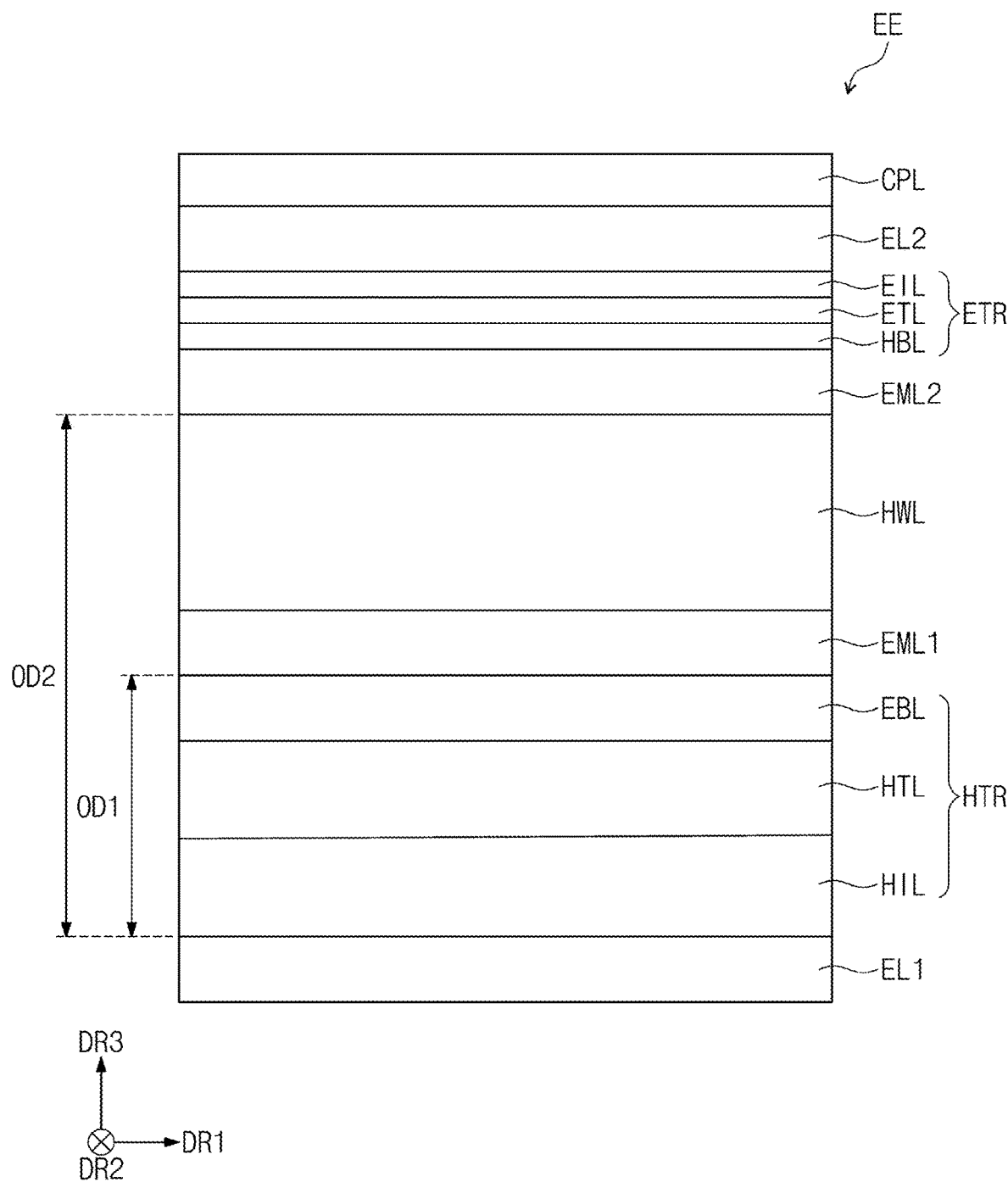
FIG. 5 is a cross-sectional view schematically illustrating a light emitting element according to an embodiment.

FIG. 1 is a perspective view of a display panel (DP) according to an embodiment. FIG. 2 is a cross-sectional view of the display panel (DP) illustrated in FIG. 1, according to an embodiment. FIGS. 3 to 5 are cross-sectional views schematically illustrating the light emitting elements (EE) according to an embodiment. At least one of a plurality of light emitting elements (EE-1, EE-2, EE-3) illustrated in FIG. 2 may include the structure of the light emitting element illustrated in FIG. 3.

The display panel (DP) may be a liquid crystal display panel, an electrophoretic display panel, a microelectromechanical system (MEMS) display panel, an electrowetting display panel, an organic light emitting display panel, a micro LED display panel, a quantum dot display panel, a quantum rod display panel, or a combination thereof, but embodiments are not limited thereto.

In some embodiments, the display panel (DP) may further include a chassis member or a molding member, and may further include a backlight unit, according to (e.g., depending on) the type of display panel (DP).

The display panel (DP) may include a lower display substrate (100) and an upper display substrate (200), which is spaced apart from and faces the lower display substrate (100). In some embodiments, a charging layer may be between the lower display substrate (100) and the upper display substrate (200).

As illustrated in FIG. 1, the display panel (DP) may display an image through a display surface (DP-IS). The display surface (DP-IS) may be parallel (e.g., substantially parallel) to the surface (e.g., the plane) defined by a first direction (DR1) and a second direction (DR2). The display surface (DP-IS) may include a display area (DA) and a non-display area (NDA). A pixel (PX) is at the display area (DA). The non-display area (NDA) is along the edge of the display surface (DP-IS). The non-display area (NDA) is adjacent to the display area (DA). The non-display area (NDA) may partially or entirely surround the display area (DA).

A direction normal to the display surface (DP-IS), such as, for example, the thickness direction of the display panel (DP), may correspond to a third direction (DR3). The front (or upper) surface and the rear (or lower) surface of each layer or unit described herein may be defined according to the third direction (DR3). The front and rear surfaces are opposed to each other in the third direction (DR3). However, directions indicated by the first direction to the third direction (DR1, DR2, DR3) are relative concepts and may thus be changed to other directions. The first direction to the third direction (DR1, DR2, DR3) are directions respectively indicated by (e.g., respectively illustrated by) the first direction to the third direction (DR1, DR2, DR3), as illustrated in the drawings.

In some embodiments of the present disclosure, the display panel (DP) is illustrated to have a flat display surface (DP-IS), but embodiments are not limited thereto. The display panel (DP) may include a curved display surface or a stereoscopic display surface. The stereoscopic display surface may include a plurality of display areas oriented in different directions.

FIG. 2 illustrates a cross-section of a display panel (DP) taken along the line I-I' of FIG. 1, according to an embodiment. The display panel (DP) according to some embodiments may include a plurality of light emitting elements (EE-1, EE-2, EE-3).

The lower display substrate (100) of the display panel (DP) according to some embodiments may include a base substrate (BS), a circuitry layer (CL), and a display element layer (OEL). The base substrate (BS) may provide (e.g., may include) a base surface on which the display element layer (OEL) is on. The base substrate (BS) may include a glass substrate, a metal substrate, a plastic substrate, etc., but embodiments are not limited thereto.

In some embodiments, the circuitry layer (CL) may be on the base substrate (BS). The circuitry layer (CL) may include a plurality of transistors. The transistors may each include a control electrode, an input electrode, and an output electrode. For example, the circuitry layer (CL) may include a switching transistor and a driving transistor for driving the plurality of light emitting elements (EE-1, EE-2, EE-3) of the display element layer (OEL).

The display element layer (OEL), according to some embodiments, may include pixel defining films (PDL), a plurality of light emitting elements (EE-1, EE-2, EE-3) and an encapsulation layer (TFE). The plurality of light emitting elements (EE-1, EE-2, EE-3) may be between the pixel defining film (PDL). For example, the pixel defining film (PDL) may be on either side of each of the plurality of light emitting elements (EE-1, EE-2, EE-3). The encapsulation layer (TFE) may be on the plurality of light emitting elements (EE-1, EE-2, EE-3). The encapsulation layer (TFE) may cover the plurality of light emitting elements (EE-1, EE-2, EE-3). In some embodiments, the encapsulation layer (TFE) may protect the light emitting elements (EE-1, EE-2, EE-3). For example, the encapsulation layer (TFE) may cover the upper surface of the second electrode (EL2) that is over an opening (OH). The encapsulation layer (TFE) may include an inorganic layer and/or an organic layer.

In some embodiments, the encapsulation layer (TFE) may include two inorganic layers and an organic layer therebetween. In some embodiments, the encapsulation layer (TFE) may include a plurality of inorganic layers and a plurality of organic layers laminated (e.g., arranged) alternately. In some embodiments where the encapsulation layer (TFE) includes inorganic and/or organic layers, the inorganic layer may protect the light emitting elements (EE-1, EE-2, EE-3) from moisture and/or oxygen, and the organic layer may protect the light emitting elements (EE-1, EE-2, EE-3) from foreign substances such as, for example, dust particles.

The plurality of light emitting elements (EE-1, EE-2, EE-3) according to some embodiments may each include a first electrode (EL1), a hole transport area (HTR), a first organic layer to a third organic layer (OL1, OL2, OL3), an electron transport area (ETR), and a second electrode (EL2). The plurality of light emitting elements (EE-1, EE-2, EE-3) will be described in more detail in the later explanation of the light emitting elements (EE).

The display panel (DP), according to some embodiments, may include a non-light emitting area (NPXA) and a plurality of light emitting areas (PXA-B, PXA-G, PXA-R). The light emitting areas (PXA-B, PXA-G, PXA-R) may be areas in which light produced in each of the plurality of respective light emitting elements (EE-1, EE-2, EE-3) is emitted. A plurality of light emitting areas (PXA-B, PXA-G, PXA-R) may be spaced apart from each other when viewed from the top (e.g., from a plan view).

The plurality of light emitting areas (PXA-B, PXA-G, PXA-R) may be classified into a plurality of groups according to the color of the light produced by the plurality of respective light emitting elements (EE-1, EE-2, EE-3).

The display panel (DP), according to some embodiments of the present disclosure, is exemplarily illustrated to have three light emitting areas (PXA-B, PXA-G, PXA-R) which emit blue light, green light, and red light, respectively. For example, the display panel (DP), according to some embodiments, may include a blue light emitting area (PXA-B), a green light emitting area (PXA-G), and a red light emitting area (PXA-R), which are distinguishable from one another.

The plurality of light emitting elements (EE-1, EE-2, EE-3) may emit lights having different wavelength ranges. For example, the display panel (DP), according to some embodiments, may include the first light emitting element (EE-1), which emits blue light, the second light emitting element (EE-2), which emits green light, and the third light emitting element (EE-3), which emits red light. However, the embodiments are not limited thereto. In some embodiments, the first to third light emitting elements (EE-1, EE-2, EE-3) may emit lights having the same wavelength range. In some embodiments, at least one of the light emitting elements may emit light having a wavelength range differing from the other light emitting elements.

In some embodiments, the blue light emitting area (PXA-B), the green light emitting area (PXA-G) and the red light emitting area (PXA-R) of the display panel (DP) may correspond to the first light emitting element (EE-1), the second light emitting element (EE-2), and the third light emitting element (EE-3), respectively.

The plurality of light emitting areas (PXA-R, PXA-G, PXA-B) may be divided by the pixel defining film (PDL). The non-light emitting areas (NPXA) are between the neighboring light emitting areas (PXA-B, PXA-G, PXA-R) and may correspond to the pixel defining film (PDL). The plurality of light emitting areas (PXA-B, PXA-G, PXA-R) herein may correspond to the pixels (PX), respectively. The pixel defining film (PDL) may divide the plurality of light emitting elements (EE-1, EE-2, EE-3). A plurality of organic layers (OL1, OL2, OL3), which are respectively included in the plurality of light emitting elements (EE-1, EE-2, EE-3), may be separately in the openings (OH) defined by the pixel defining film (PDL).

The pixel defining film (PDL) may include a polymer resin. For example, the pixel defining film (PDL) may include a polyacrylate-based resin and/or a polyimide-based resin. The pixel defining film (PDL) may also include an inorganic material in addition to the polymer resin. In some embodiments, the pixel defining film (PDL) may include a light absorbing material, and/or may include a black pigment and/or a black dye. In some embodiments where the pixel defining film (PDL) includes a black pigment or a black dye, the pixel defining film (PDL) may serve as (e.g., may be) a black pixel defining film. In some embodiments where the pixel defining film (PDL) includes black pigment and/or black dye, the black pigment and/or black dye may be carbon black, but embodiments are not limited thereto.

In some embodiments, the pixel defining film (PDL) may include inorganic materials. For example, the pixel defining film (PDL) may include silicon nitride (SiNx), silicon oxide (SiOx), and/or silicon nitrate (SiOxNy), etc.

The upper display substrate (200), according to some embodiments, may include a base layer (BL) and a polarizing layer (POL). However, the embodiments are not limited thereto.

The base layer (BL) may be a glass substrate, a metal substrate, a plastic substrate, etc. The base layer (BL) may provide (e.g., may include) a base surface on which the polarizing layer (POL) is on.

The display panel (DP), according to some embodiments, may include the polarizing layer (POL). The polarizing layer (POL) may block external light entering the display panel (DP). For example, in some embodiments, the polarizing layer (POL) may block a portion of the external light. In some embodiments, the polarizing layer (POL) may reduce reflected light produced from the external light on the display panel (DP). For example, in some embodiments, the polarizing layer (POL) may reduce the reflection of light that is incident upon the display panel (DP) from outside the display panel (DP). For example, in some embodiments, the polarizing layer (POL) may block the reflected light produced when light from outside of the display panel (DP) is incident on the display panel (DP) and then emitted outward.

FIG. 2 exemplarily illustrates that the polarizing layer (POL) is on the base layer (BL) and is exposed (e.g., is exposed to the outside of the display panel (DP)), but the embodiments are not limited thereto. For example, the polarizing layer (POL) may be below the base layer (BL).

FIG. 2 exemplarily illustrates an embodiment where the upper display substrate (200) includes the polarizing layer (POL). However, the embodiments are not limited thereto and, in some embodiments, the polarizing layer (POL) may be omitted. The upper display substrate (200), in some embodiments, may not include the polarizing layer (POL) and may include a color filter layer. The color filter layer may include color filter units, which respectively correspond to the blue light emitting area (PXA-B), the green light emitting area (PXA-G), and the red light emitting area (PXA-R).

In the embodiments illustrated in FIGS. 1 and 2, the display panel (DP) includes the upper display substrate (200). However, in some embodiments, the upper display substrate (200) of the display panel (DP) may be omitted.

With reference to the FIG. 3, the light emitting element (EE), according to an embodiment, may include the first electrode (EL1), the second electrode (EL2), the first light emitting layer (EML1), the second light emitting layer (EML2), the intermediate layer (HWL), the hole transport area (HTR), and the electron transport area (ETR). In some embodiments, a capping layer (CPL) on the second electrode (EL2) may be included. However, embodiments are not limited thereto, and, in some embodiments, the light emitting element (EE) may exclude the capping layer (CPL).

FIG. 4 illustrates a cross-sectional view of the light emitting element (EE), according to an embodiment, in which the hole transport area (HTR) includes a hole injection layer (HIL) and a hole transport layer (HTL), and the electron transport area (ETR) includes an electron injection layer (EIL) and an electron transport layer (ETL).

FIG. 5 illustrates a cross-sectional view of the light emitting element (EE), according to an embodiment, in which the hole transport area (HTR) includes a hole injection layer (HIL), a hole transport layer (HTL), and an electron blocking layer (EBL), and the electron transport area (ETR) includes an electron injection layer (EIL), an electron transport layer (ETL), and a hole blocking layer (HBL).

The first electrode (EL1) has conductivity (e.g., electrical conductivity). The first electrode (EL1) may include a metal alloy and/or a conductive compound. The first electrode (EL1) may be an anode. Also, the first electrode (EL1) may be a pixel electrode. The first electrode (EL1), according to some embodiments, may include a conductive material. The first electrode (EL1) may be a reflective electrode. For example, the first electrode (EL1) may include a high reflectivity material such as, for example, silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), and/or titanium (Ti), and/or a compound or mixture thereof.

The first electrode (EL1) may be a monolayer (e.g., a single layer) or a multilayer. For example, the first electrode (EL1) may have a monolayer (e.g., single layer) structure of indium tin oxide (ITO) or a metal mixture, a bilayer (e.g., double layer) structure of ITO/Mg or ITO/MgF, or a trilayer (e.g., triple layer) structure of ITO/Ag/ITO.

The first electrode (EL1) may be a semi-transmissive (e.g., semi-transparent) or a transmissive (e.g., transparent) electrode. For example, the first electrode (EL1) may include a transparent conductive oxide, such as, for example, at least any one of indium tin oxide (ITO), indium zinc oxide (IZO), tin oxide ($SnO_2$), or zinc oxide (ZnO). However, the first electrode (EL1) is not limited thereto.

The second electrode (EL2) may be over the first electrode (EL1). In some embodiments, the second electrode (EL2) may face the first electrode (EL1). In some embodiments, the second electrode (EL2) may be a common electrode. In some embodiments, the second electrode (EL2) may be a cathode electrode. For example, when the first electrode (EL1) is an anode electrode, the second electrode (EL2) may be a cathode electrode.

The second electrode (EL2) may be a reflective electrode, a semi-transmissive (e.g., semi-transparent) electrode or a transmissive (e.g., transparent) electrode layer. However, the second electrode (EL2) is not limited thereto. The second electrode (EL2) includes a conductive material. The conductive material may include metals, alloys, electroconductive compounds, and/or mixtures thereof. For example, the second electrode (EL2) may include a reflective material including at least one or more selected from lithium (Li), magnesium (Mg), aluminum (Al), aluminum-lithium (Al—Li), calcium (Ca), magnesium-indium (Mg—In), and magnesium-silver (Mg—Ag). In some embodiments, the second electrode (EL2) may include a transmissive (e.g., transparent) material including at least one or more selected from indium tin oxide (ITO), indium zinc oxide (IZO), zinc oxide (ZnO), and indium tin zinc (ITZO).

The second electrode (EL2) may be monolayer (e.g., a single layer) or a multilayer. A multilayer may include one or more layers including a reflective material or one or more layers including a transmissive (e.g., transparent) material.

The plurality of light emitting layers (EML1, EML2) may be between the first electrode (EL1) and the second electrode (EL2). The plurality of light emitting layers (EML1, EML2) each includes a host material and a dopant material. The plurality of light emitting layers (EML1, EML2) may each include a phosphor light emitting material or a fluorescent light emitting material. The host material may be any suitable material that is generally used. For example, the host material may employ (e.g., may include or may be composed of) Alq3(tris(8-hydroxyquinolino)aluminum), CBP (4,4'-bis(N-carbazolyl)-1,1'-biphenyl), PVK (poly(n-vinylcabazole)), ADN (9,10-di(naphthalene-2-yl)anthracene), TCTA (4,4',4"-Tris(carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2'-dimethylbiphenyl), and/or MADN (2-Methyl-9,10-bis (naphthalen-2-yl)anthracene), etc.

By combining a host material and a dopant material, the colors of light emitted by the first light emitting layer (EML1) and the colors of light emitted by the second light emitting layer (EML2) may be determined. In some embodiments, when the first light emitting layer (EML1) and the second light emitting layer (EML2) emit red color, the light emitting layers (EML1, EML2) may each include a fluorescent material including PBD:Eu(DBM)$_3$(Phen)(tris (dibenzoylmethanato)phenanthoroline europium) and/or perylene.

In some embodiments, the dopant material included in the first light emitting layer (EML1) and in the second light emitting layer (EML2) may be one or more selected from an organometallic complex and a metal complex such as. Some examples of the metal complex include one or more selected from PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum).

In some embodiments where the first light emitting layer (EML1) and the second light emitting layer (EML2) emit green light, the first light emitting layer (EML1) and the second light emitting layer (EML2) may include a fluorescent material including Alq3(tris(8-hydroxyquinolino)aluminum). The dopant materials included in the first light emitting layer (EML1) and in the second light emitting layer (EML2) may be one or more selected from, for example, an organometallic complex and a metal complex such as, for example, Ir(ppy)3(fac-tris(2-phenylpyridine)iridium).

In some embodiments where the first light emitting layer (EML1) and the second light emitting layer (EML2) emit blue color light, the first light emitting layer (EML1) and the second light emitting layer (EML2) may include one or more fluorescent materials selected from the group consisting of spiro-DPVBi, spiro-6P, distyryl-benzene (DSB), distyryl-arylene (DSA), a polyfluorene (PFO)-based polymer, and a poly(p-phenylene vinylene or PPV)-based polymer. In some embodiments, the dopant material included in the first light emitting layer (EML1) and the second light emitting layer (EML2) may include one or more selected from, for example, an organometallic complex and a metal complex such as, for example, (4,6-F$_2$ppy)$_2$Irpic.

The plurality of light emitting layers (EML1, EML2), according to some embodiments of the present disclosure, may include the first light emitting layer (EML1) and the second light emitting layer (EML2). In some embodiments, the first light emitting layer (EML1) may be between the first electrode (EL1) and the second light emitting layer (EML2).

The first light emitting layer (EML1) emits a first light. The second light emitting layer (EML2) emits a second light. In the light emitting element (EE), according to some embodiments, the first light and the second light may have substantially the same wavelength range. In some embodiments, the first light emitting layer (EML1) and the second light emitting layer (EML2) may produce light having the same or substantially the same color (e.g., the same or substantially the same wavelength range). In some embodiments, the first light and the second light may be blue light having a wavelength range of about 410 nm to about 480 nm. In some embodiments, the first light and the second light may be green light having a wavelength range of about 500 nm to about 570 nm. In some embodiments, the first light and the second light may be red light having a wavelength range of about 625 nm to about 675 nm. However, the embodiments of the present disclosure are not limit thereto. In some embodiments, the first light emitting layer (EML1) and the second light emitting layer (EML2) may emit light having any suitable color, and, in some embodiments, the first light emitting layer (EML1) may emit light having a different color than the color of light emitted by the second emitting layer (EML2).

The first light emitting layer (EML1) and the second light emitting layer (EML2) may each be formed by any suitable method such as, for example, vacuum evaporation (e.g., chemical or physical vapor deposition), spin coating, casting, Langmuir-Blodgett (LB) method, inkjet printing, laser printing, and laser induced thermal imaging (LITI).

The light emitting element (EE), according to some embodiments of the present disclosure, includes an intermediate layer (HWL). In some embodiments, the intermediate layer is between the first light emitting layer (EML1) and the second light emitting layer (EML2). The intermediate layer (HWL) may include a single material. In some embodiments, the intermediate layer may include (e.g., may be composed of) a host material. For example, the intermediate layer (HWL) may include an anthracene-based host material. In some embodiments, the intermediate layer (HWL) may include the same material as the host material included in the first light emitting layer (EML1) and the second light emitting layer (EML2).

In some embodiments, the intermediate layer (HWL) has a bipolar characteristic. For example, in some embodiments, the host material in the intermediate layer (HWL) may have the characteristic of (e.g., be capable of) transporting both electrons and holes. For example, the holes remaining in the first light emitting layer (EML1) after emission may move to the second light emitting layer (EML2) through the intermediate layer (HWL). The moved holes may then combine with electrons in the second light emitting layer (EML2) and emit light. Also, the electrons remaining in the second light emitting layer (EML2) after emission may move to the first light emitting layer (EML1) through the intermediate layer (HWL). The moved electrons may then combine with holes in the first light emitting layer (EML1) and emit light. Therefore, the luminous efficiency and service life of the light-emitting element (EE) may be improved.

The intermediate layer (HWL) may have a monolayer (e.g., single layer) structure including (e.g., composed of) a single material. The thickness of the intermediate layer (HWL) may range from about 90 nm to about 170 nm. The thickness of the intermediate layer (HWL) may change according to (e.g., may depend on) the wavelength range of light emitted from the light emitting element (EE). When the wavelength range of the light emitted from the light emitting element (EE) is from about 410 nm to about 480 nm, the thickness of the intermediate layer (HWL) may be in a range from about 90 nm to about 120 nm. When the wavelength range of the light emitted from the light emitting element (EE) is from about 500 nm to about 570 nm, the thickness of the intermediate layer (HWL) may be in a range from about 100 nm to about 130 nm. When the wavelength range of the light emitted from the light emitting element (EE) is from about 625 nm to about 675 nm, the thickness of the intermediate layer (HWL) may be in a range from about 120 nm to about 170 nm.

The hole transport area (HTR) is between the first electrode (EL1) and the first light emitting layer (EML1). The hole transport area (HTR) may include at least one of the hole injection layer (HIL), the hole transport layer (HTL), and the electron blocking layer (EBL). The hole transport area (HTR) may have a monolayer (e.g., single layer) structure including (e.g., composed of) a single material; a monolayer (e.g., single layer) structure including (e.g., composed of) a plurality of different materials; or a multilayer structure having a plurality of layers, each layer including (e.g., each layer composed of) a single material or a plurality of different materials.

In some embodiments, the hole transport area (HTR) may have a monolayer (e.g., single layer) structure including (e.g., composed of) the hole injection layer (HIL) or the hole transport layer (HTL), and may have a monolayer (e.g., single layer) structure including (e.g., composed of) a hole injection material or a hole transport material. In some embodiments, the hole transport area (HTR) may have a monolayer (e.g., single layer) structure including (e.g., composed of) a plurality of different materials. In some embodiments, the hole transport area (HTR) may have a structure in which the hole injection layer (HIL) and the hole transport layer (HTL) are laminated in this order from the first electrode (EL1). For example, in some embodiments, the first electrode (EL1), the hole injection layer (HIL), and the hole transport layer (HTL) may be laminated in this order. In some embodiments, the hole transport area (HTR) may have a structure in which the hole injection layer (HIL), the hole transport layer (HTL), and the electron blocking layer (EBL) are laminated in this order from the first electrode (EL1).

The hole transport area (HTR) may be formed by any suitable method such as, for example, vacuum evaporation (e.g., chemical or physical vapor deposition), spin coating, casting, Langmuir-Blodgett (LB) method, inkjet printing, and laser induced thermal imaging (LITI).

The hole injection area (HIL) may include, for example, a phthalocyanine compound such as, for example, copper phthalocyanine, DNTPD (N,N'-diphenyl-N,N'-bis-[4-(phenyl-m-tolyl-amino)-phenyl]-biphenyl-4,4'-diamine), m-MTDATA (4,4',4''-tris(3-methylphenylphenylamino) triphenylamine), TDATA (4,4'4''-Tris(N,N-diphenylamino) triphenylamine), 2-TNATA (4,4',4''-tris{N,-(2-naphthyl)-N-phenylamino}-triphenylamine), PEDOT/PSS (Poly(3,4-ethylenedioxythiophene)/Poly(4-styrenesulfonate)), PANI/DBSA (Polyaniline/Dodecylbenzenesulfonic acid), PANI/CSA (Polyaniline/Camphor sulfonicacid), PANI/PSS ((Polyaniline)/Poly(4-styrenesulfonate)), NPB (N,N'-di(naphthalene-1-yl)-N,N'-diphenyl-benzidine), triphenylamine-containing polyether ketone (TPAPEK), 4-Isopropyl-4'-methyldiphenyliodonium Tetrakis(pentafluorophenyl) borate], and/or HAT-CN (dipyrazino[2,3-f:2',3'-h] quinoxaline-2,3,6,7,10,11-hexacarbonitrile), etc.

The hole transport layer (HTL) may include, for example, a carbazole derivative such as, for example, N-phenylcarbazole, and/or polyvinyl carbazole; a fluorine derivative; a triphenylamine derivative such as, for example, TPD (N,N-bis(3-methylphenyl)-N,N'-diphenyl-[1,1-biphenyl]-4,4'-diamine), and/or TCTA (4,4',4''-tris(N-carbazolyl)triphenylamine); NPB (N,N'-di(naphthalene-1-yl)-N,N'-diphenyl-benzidine); TAPC (4,4'-Cyclohexylidene bis[N,N-bis(4-methylphenyl)benzenam ine]); HMTPD (4,4'-Bis[N, N'-(3-tolyl)amino]-3,3'-dimethylbiphenyl); and/or mCP (1,3-Bis(N-carbazolyl)benzene); etc.

The electron blocking layer (EBL) may prevent or reduce the injection of electrons from the electron transport area (ETR) into the hole transport area (HTR).

The hole transport area (HTR) may further include a charge generation material for improving conductivity (e.g., electrical conductivity). The charge generation material may be evenly or unevenly dispersed in the hole transport area (HTR). The charge generation material may be, for example, a p-dopant. The p-dopant may include a quinone derivative, a metal oxide, or a cyano group-containing compound, but embodiments are not limited thereto. For example, non-limiting examples of the p-dopant may include a quinone derivative such as, for example, TCNQ (Tetracyanoquinodimethane) and/or F4-TCNQ (2,3,5,6-tetrafluoro-tetracyanoquinodimethane), and/or a metal oxide such as, for example, tungsten oxide and/or molybdenum oxide.

The electron transport area (ETR) may be between the second light emitting layer (EML2) and the second electrode (EL2). The electron transport area (ETR) may include at least one of the hole blocking layer (HBL), the electron transport layer (ETL) or the electron injection layer (EIL), but the embodiments are not limited thereto.

The electron transport area (ETR) may have a monolayer (e.g., single layer) structure including (e.g., composed of) a single material; a monolayer (e.g., single layer) structure including (e.g., composed of) a plurality of different materials; or a multilayer structure having a plurality of layers, each layer including (e.g., composed of) a single material or a plurality of different materials.

For example, the electron transport area (ETR) may have a monolayer (e.g., single layer) structure including (e.g., composed of) the electron injection layer (EIL) or the electron transport layer (ETL). In some embodiments, the electron transport area (ETR) may have a monolayer (e.g., single layer) structure including (e.g., composed of) an electron injection material and an electron transport material. In some embodiments, the electron transport area (ETR) may have a monolayer (e.g., single layer) structure including (e.g., composed of) a plurality of different materials, but embodiments are not limited thereto. In some embodiments, the electron transport area (ETR) may have a structure in which the electron transport layer (ETL) and the electron injection layer (EIL) are laminated in this order from the second light emitting layer (EML2). For example, in some embodiments, the second light emitting layer (EML2), the electron transport layer (ETL), and the electron injection layer (EIL) may be laminated in this order. In some embodiments, the electron transport area (ETR) may have a structure in which the hole blocking layer (HBL), the electron transport layer (ETL), and the electron injection layer (EIL) are laminated in this order from the second light emitting layer (EML2).

The electron transport area (ETR) may be formed by any suitable method such as, for example, vacuum evaporation (e.g., chemical or physical vapor deposition), spin coating, casting, Langmuir-Blodgett (LB) method, inkjet printing, laser printing, laser induced thermal imaging (LITI), etc.

When the electron transport area (ETR) includes the electron transport layer (ETL), the electron transport area (ETR) may include an anthracene-based compound, but embodiments are not limited thereto. For example, in some embodiments, the electron transport area (ETR) may include, for example, $Alq_3$(Tris(8-hydroxyquinolinato)aluminum); 1,3,5-tri[(3-pyridyl)-phen-3-yl]benzene; 2,4,6-tris (3'-(pyridin-3-yl)biphenyl-3-yl)-1,3,5-triazine; 2-(4-(N-phenylbenzoimidazolyl-1-ylphenyl)-9,10-dinaphthylanthracene; TPBi (1,3,5-Tri(1-phenyl-1H-benzo[d]imidazol-2-yl)phenyl); BCP (2,9-Dimethyl-4,7-diphenyl-1,10-phenanthroline); Bphen (4,7-Diphenyl-1,10-phenanthroline); TAZ (3-(4-Biphenylyl)-4-phenyl-5-tert-butylphenyl-1,2,4-triazole); NTAZ (4-(Naphthalen-1-yl)-3,5-diphenyl-4H-1,2,4-triazole); tBu-PBD (2-(4-Biphenylyl)-5-(4-tert-butylphenyl)-1,3,4-oxadiazole); BAlq (Bis(2-methyl-8-quinolinolato-N1,O8)-(1,1'-Biphenyl-4-olato) aluminum); $Bebq_2$ (berylliumbis(benzoquinolin-10-olate); ADN (9,10-di(naphthalene-2-yl)anthracene); and/or a mixture thereof.

When the electron transport area (ETR) includes the electron transport layer (ETL), the electron transport area (ETR) may use (e.g., may include) a metal halide such as, for example, LiF, NaCl, CsF, RbCl, RbI, and/or CuI; a lanthanide metal such as, for example, Yb; a metal oxide such as, for example, $Li_2O$ and/or BaO; and/or lithium quinolate (Liq), but embodiments are not limited thereto. The electron injection layer (EIL) may also include (e.g., be composed of) a mixture material of the electron transport material and an insulating organo metal salt. For example, in some embodiments, the electron injection layer (EIL) may include (e.g., may be composed of) a mixture of one or more materials selected from among the materials that may be included in the electron transport layer (ETL), and an insulating organo metal salt. The insulating organo metal salt may be a material having an energy band gap of about 4 eV or higher. In some embodiments, the insulating organo metal salt may include metal acetate, metal benzoate, metal acetoacetate, metal acetylacetonate, and/or metal stearate.

As mentioned above, the electron transport area (ETR) may include the hole blocking layer (HBL). The hole blocking layer (HBL) may include, for example, at least one of BCP (2,9-dimethyl-4,7-diphenyl-1,10-phenanthroline) and/or Bphen (4,7-diphenyl-1,10-phenanthroline), but embodiments are not limited thereto.

In the light emitting elements (EE), according to some embodiments, as a voltage is applied to the first electrode (EL1) and the second electrode (EL2), holes from the first electrode (EL1) move to the first light emitting layer (EML1) through the hole transport area (HTR), and move from the first light emitting layer (EML1) to the second light emitting layer (EML2) through the intermediate layer (HWL). Further, electrons from the second electrode (EL2) move to the second light emitting layer (EML2) through the electron transport area (ETR), and move from the second light emitting layer (EML2) to the first light emitting layer (EML1) through the intermediate layer (HWL). The electrons and the holes recombine with each other in each of the first light emitting layer (EML1) and the second light emitting layer (EML2) to produce excitons, and light is emitted as the excitons transition from the excited state to the ground state. In some embodiments, the wavelength range of the first light emitted from the first light emitting layer (EML1) may be the same or substantially the same as the wavelength range of the second light emitted from the second light emitting layer (EML2).

In some embodiments, the light emitting element (EE) has a first optical distance (OD1) and a second optical distance (OD2). The first optical distance (OD1) may be a distance at which the light produced by the first light emitting layer (EML1) reflects from the reflective interface and secondarily resonates. For example, in some embodiments, the first optical distance (OD1) may be a distance in the third direction (DR3) that light produced in the first light emitting layer (EML1) travels before reflecting from the upper surface of the first electrode (EL1). The second optical distance (OD2) may be a distance at which the light produced by the second light emitting layer (EML2) reflects from the reflective interface and tertiarily resonates. For example, in some embodiments, the second optical distance (OD2) may be a distance in the third direction (DR3) that light produced in the second light emitting layer (EML2) travels before reflecting from the upper surface of the first electrode (EL1). In some embodiments, the first electrode (EL1) may be a reflective electrode, and the first electrode (EL1) may include an upper surface (EL1-T) facing the second electrode (EL2) and a lower surface (EL1-B) opposite to the upper surface (EL1-T). The reflective interface may be an upper surface (EL1-T) of the first electrode (EL1).

And the first light emitting layer (EML1) may include an upper surface (EML1-T) facing the second electrode (EL2) and a lower surface (EML1-B) opposite to the upper surface (EML1-T). The second light emitting layer (EML2) may include an upper surface (EML2-T) facing the second electrode (EL2) and a lower surface (EML2-B) opposite to the upper surface (EML2-T).

In some embodiments, the first optical distance (OD1) may be defined as a minimum distance from the upper surface (EL1-T) of the first electrode (EL1) to a lower surface (EML1-B) of the first light emitting layer (EML1). The first optical distance (OD1) may be the same or substantially the same as the thickness of the hole transport area (HTR). The first optical distance (OD1) may change according to (e.g., may depend on) the wavelength range of the light emitted from the light emitting element (EE). The first optical distance (OD1) may be optimized or improved by adjusting the thickness of the hole transport area (HTR) (e.g., by forming the hole transport area (HTR) during a manufacturing process to have a thickness) according to (e.g., depending on) the wavelength range of the light emitted from the light emitting element (EE).

The second optical distance (OD2) may be defined as a minimum distance from the upper surface (EL1-T) of the first electrode (EL1) to a lower surface (EML2-B) of the second light emitting layer (EML2). The second optical distance (OD2) may change according to (e.g., may depend on) the wavelength range of the light emitted from the light emitting element (EE). The second optical distance (OD2) may be optimized or improved by adjusting the thicknesses of the hole transport area (HTR) and the intermediate layer (HWL) (e.g., by forming the hole transport area (HTR) and the intermediate layer (HWL) during a manufacturing process to have a thickness) according to (e.g., depending on) the wavelength range of the light emitted from the light emitting element (EE).

The light emitting element (EE), according to some embodiments of the present disclosure, emits the first light in (e.g., from) the first light emitting layer (EML1), and emits the second light in (e.g., from) the second light emitting layer (EML2). In some embodiments, the first light and the second light may have the same or substantially the same wavelength range.

In some embodiments, when the first light and the second light have a wavelength range of about 410 nm to about 480 nm, the first optical distance (OD1) may be from about 230 nm to about 300 nm. In some embodiments, the thickness of the intermediate layer (HWL) may be from about 90 nm to about 120 nm.

In some embodiments, when the first light and the second light have a wavelength range of about 500 nm to about 570 nm, the second optical distance (OD2) may be from about 250 nm to about 330 nm. In some embodiments, the thickness of the intermediate layer (HWL) may be from about 100 nm to about 130 nm.

In some embodiments, when the first light and the second light have a wavelength range of about 625 nm to about 675 nm, the first optical distance (OD1) may be from about 170 nm to about 230 nm. In some embodiments, the second optical distance (OD2) may be from about 290 nm to about 400 nm. In some embodiments, the thickness of the intermediate layer (HWL) may be from about 120 nm to about 170 nm. However, embodiments are not limited thereto.

In terms of manufacturing processes, the thickness of the electron transport area (ETR) may be maintained constantly (e.g., the electron transport area (ETR) may be formed with a constant thickness) regardless of the wavelength range of light to be emitted. In some embodiments, the thickness of the electron transport area (ETR) may be from about 20 nm to about 45 nm, but embodiments are not limited thereto.

Referring again to FIG. 2, the display panel (DP), according to an embodiment, may include the first light emitting element (EE-1), which may emit light having a wavelength range of about 410 nm to about 480 nm; the second light emitting element (EE-2), which may emit light with a wavelength range of about 500 nm to about 570 nm; and the third light emitting element (EE-3), which may emit light having a wavelength range of about 625 nm to about 675 nm.

With reference to FIGS. 2 and 3, it is illustrated in FIG. 2 that the first organic layer to the third organic layer (OL1, OL2, OL3) are respectively included in the first light emitting element to the third light emitting element (EE-1, EE-2, EE-3), and it is illustrated in FIG. 3 that each of the first light emitting element to the third light emitting element (EE-1, EE-2, EE-3) may have the first light emitting layer (EML1), the intermediate layer (HWL), and the second light emitting layer (EML2). In the display panel (DP), according to some embodiments, the thicknesses of the first light emitting layer (EML1) and of the intermediate layer (HWL) may change according to (e.g., may depend on) the wavelength range of light to be emitted. Accordingly, the thicknesses of the first organic layer to the third organic layer (OL1, OL2, OL3) may change according to (e.g., may depend on) the wavelength range of light to be emitted.

Table 1 below shows the luminous efficiency and the service life of the light emitting elements. Examples 1, 2, and 3 are light emitting elements (EE) according to some embodiments of the present disclosure. Comparative examples 1-1, 2-1, and 3-1 are light emitting elements, each including one light emitting layer. Comparative examples 1-2, 2-2, and 3-2 are light emitting elements, each having one light emitting layer in which a thin film with a thickness ranging from about 2 nm to about 15 nm is inserted (e.g., is included).

TABLE 1

| Examples | color | Efficiency (%) | Service life (%) |
| --- | --- | --- | --- |
| Example 1 | Blue | 140 | 150 |
| Comparative example 1-1 | | 100 | 100 |
| Comparative example 1-2 | | 90 | 90 |
| Example 2 | Green | 130 | 150 |
| Comparative example 2-1 | | 100 | 100 |
| Comparative example 2-2 | | 90 | 100 |
| Example 3 | Red | 130 | 150 |
| Comparative example 3-1 | | 100 | 100 |
| Comparative example 3-2 | | 85 | 90 |

With reference to Table 1, in consideration of the embodiments where blue light, green light, and red light are to be emitted from respective elements, it can be seen that the efficiency and the service life of light emitting elements of Examples 1 to 3 are improved compared to the comparative examples. Comparative examples 1-1, 2-1, and 3-1 include one light emitting layer and utilize only secondary resonance. Therefore, compared to Examples 1 to 3, in which secondary resonance and tertiary resonance are used at the same time, Comparative examples 1-1, 2-1, and 3-1 exhibit reduced efficiency and service life characteristics. Comparative examples 1-2, 2-2, and 3-2 are light emitting elements, each including one light emitting layer in which a thin film having a thickness of from about 2 nm to about 15 nm is inserted. In Comparative examples 1-2, 2-2, and 3-2, a part of the light emitting layer deviates from the resonance distance due to the thin film inserted in the light emitting layer, which makes it difficult for the emitted light to contribute to the secondary resonance. Therefore, only the light emitted from another part of the light emitting layer secondarily resonates so that Comparative examples 1-2, 2-2, and 3-2 exhibit the lowest luminous efficiency and the shortest service life. From these results, it can be seen that the light emitting element, according to some embodiments of the present disclosure, which uses both the secondary resonance and the tertiary resonance, have improvements in efficiency and in service life.

The light emitting element (EE), according to some embodiments of the present disclosure, may include the intermediate layer (HWL), and the first optical distance (OD1) and the second optical distance (OD2) may be adjusted by adjusting (e.g., by choosing) the thickness of the hole transport area (HTR) and the intermediate layer (HWL). Accordingly, the first light emitted from the first light emitting layer (EML1) may secondarily resonate optically. The second light emitted from the second light emitting layer (EML2) may tertiarily resonate optically. Therefore, the light emitting element (EE), according to some embodiments, may utilize secondary resonant light emission and tertiary resonant light emission concurrently (e.g., simultaneously) and, thus, the luminous efficiency and service life of the light emitting element (EE) may be improved.

A light emitting element, according to embodiments of the present disclosure, may have improved efficiency and service life.

A display panel, according to embodiments of the present disclosure, may include a light emitting element with improved efficiency and service life.

Some embodiments of the present disclosure are described above. However, many modifications and variations of these embodiments, without departing from the scope and spirit of the present disclosure, as disclosed in the claims, will be apparent to those of ordinary skill in the related art.

Accordingly, the technical scope of the present disclosure is not limited to the contents of the description of the specification, but is defined by the appended claims, and equivalents thereof.

What is claimed is:

1. A light emitting element comprising:
a first electrode;
a second electrode facing the first electrode;
a first light emitting layer between the first electrode and the second electrode to emit a first light;
a second light emitting layer between the first light emitting layer and the second electrode to emit a second light; and
an intermediate layer including a host material between the first light emitting layer and the second light emitting layer,
wherein the intermediate layer has a thickness of about 90 nm to about 170 nm, and
wherein an emission wavelength of the first light and an emission wavelength of the second light are substantially the same.

2. The light emitting element of claim 1,
wherein the intermediate layer has bipolar characteristics to transport electrons and holes.

3. The light emitting element of claim 1, wherein each of the first light emitting layer and the second light emitting layer includes the host material and a dopant material.

4. The light emitting element of claim 1, further comprising:
a hole transporting area between the first electrode and the first light emitting layer; and
an electron transporting area between the second light emitting layer and the second electrode.

5. The light emitting element of claim 1,
wherein the first electrode includes an upper surface facing the second electrode and a lower surface opposite to the upper surface,
the first light emitting layer includes an upper surface facing the second electrode and a lower surface opposite to the upper surface,
the second light emitting layer includes an upper surface facing the second electrode and a lower surface opposite to the upper surface,
a distance from the upper surface of the first electrode to the lower surface of the first light emitting layer is a first optical distance at which the first light secondarily resonates optically, and
a distance from the upper surface of the first electrode to the lower surface of the second light emitting layer is a second optical distance at which the second light tertiarily resonates optically.

6. The light emitting element of claim 5,
wherein a wavelength range of the first light is from about 410 nm to about 480 nm,
the first optical distance is in a range from about 110 nm to about 150 nm, and
the second optical distance is in a range from about 230 nm to about 300 nm.

7. The light emitting element of claim 5,
wherein a wavelength range of the first light is from about 500 nm to about 570 nm,
the first optical distance is in a range from about 150 nm to about 190 nm, and
the second optical distance is in a range from about 250 nm to about 330 nm.

8. The light emitting element of claim 5,
wherein a wavelength range of the first light is from about 625 nm to about 675 nm,
the first optical distance is in a range from about 170 nm to about 230 nm, and
the second optical distance is in a range from about 290 nm to about 400 nm.

9. The light emitting element of claim 1,
wherein a wavelength range of the first light is from about 410 nm to about 480 nm and the thickness of the intermediate layer is in a range from about 90 nm to about 120 nm.

10. The light emitting element of claim 1,
wherein a wavelength range of the first light is from about 500 nm to about 570 nm and the thickness of the intermediate layer is from about 100 nm to about 130 nm.

11. The light emitting element of claim 1,
wherein a wavelength range of the first light is from about 625 nm to about 675 nm and the thickness of the intermediate layer is from about 120 nm to about 170 nm.

* * * * *